US012608525B2

(12) United States Patent
Holzinger et al.

(10) Patent No.: US 12,608,525 B2
(45) Date of Patent: Apr. 21, 2026

(54) AUTONOMOUS DRIVE EMULATION METHODS AND DEVICES

(71) Applicant: Keysight Technologies, Inc., Santa Rosa, CA (US)

(72) Inventors: Bernhard Holzinger, Gaertringen (DE); Henrik Liebau, Boeblingen (DE); Michael Metzger, Nagold (DE)

(73) Assignee: KEYSIGHT TECHNOLOGIES, INC., Santa Rosa, CA (US)

( * ) Notice: Subject to any disclaimer, the term of this patent is extended or adjusted under 35 U.S.C. 154(b) by 1262 days.

(21) Appl. No.: 17/192,710

(22) Filed: Mar. 4, 2021

(65) Prior Publication Data

US 2021/0406562 A1      Dec. 30, 2021

Related U.S. Application Data

(60) Provisional application No. 63/043,172, filed on Jun. 24, 2020.

(51) Int. Cl.
| | |
|---|---|
| *G06K 9/00* | (2022.01) |
| *B60W 30/12* | (2020.01) |
| *G06F 9/38* | (2018.01) |
| *G06F 18/25* | (2023.01) |
| *G06F 30/331* | (2020.01) |
| *G06K 9/62* | (2022.01) |
| *G06V 20/64* | (2022.01) |

(Continued)

(52) U.S. Cl.
CPC ........... *G06F 30/331* (2020.01); *B60W 30/12* (2013.01); *G06F 9/3877* (2013.01); *G06F 18/25* (2023.01);

(Continued)

(58) Field of Classification Search
CPC ...... G06F 30/311; G06F 18/25; G06F 9/3877; G06F 17/5009; G06F 17/5095; G06V 20/64; G06V 20/58; G06V 10/803; G06V 10/776; B60W 30/12; B60W 2554/4049; B60W 2420/403; B60W 2420/52; B60W 50/00; G05D 1/0088; G05D 2201/0213; G05D 1/0214

See application file for complete search history.

(56) References Cited

U.S. PATENT DOCUMENTS 9,575,161 B1      2/2017 Haghighi et al.
10,520,586 B2    12/2019 Haghighi et al.
(Continued)

OTHER PUBLICATIONS

Michael Ernst Gradringer et al. "Radar target stimulation for automotive applications", IET Radar Sonar Navig, 2018, vol. 12, Issue 10, pp. 1096-1103.

(Continued)

*Primary Examiner* — Lixi C Simpson

(57) ABSTRACT

A hardware-in-the-loop (HiL) test system is for testing sensor fusion of an advance driver assistance system (ADAS). The ADAS includes a plurality of sensors and an electronic control unit (ECU) processing outputs of the sensors. The HiL test system includes a three-dimensional (3D) scenario simulator for generating drive scenarios including objects in a surrounding environment of a simulated vehicle, and a sensor target emulator for generating emulated sensors inputs to the plurality of sensors corresponding to the drive scenarios generated by the 3D scenario simulator. The sensor target emulator is configured to synchronize the emulated sensor inputs by interpolating a current location of the objects from parameters extracted from the drive scenarios.

20 Claims, 7 Drawing Sheets

(51) Int. Cl.

| | |
|---|---|
| *G06V 10/776* | (2022.01) |
| *G06V 10/80* | (2022.01) |
| *G06V 20/58* | (2022.01) |

(52) U.S. Cl.

CPC ....... *G06V 20/64* (2022.01); *B60W 2420/403* (2013.01); *B60W 2420/408* (2024.01); *B60W 2554/4049* (2020.02); *G06V 10/776* (2022.01); *G06V 10/803* (2022.01); *G06V 20/58* (2022.01)

(56) References Cited

U.S. PATENT DOCUMENTS

| | | | |
|---|---|---|---|
| 10,578,715 | B2 | 3/2020 | Haghighi et al. |
| 2018/0100783 | A1* | 4/2018 | Stieff .................. H04N 9/3194 |

| | | | |
|---|---|---|---|
| 2019/0152486 | A1 | 5/2019 | Schuette et al. |
| 2019/0213290 | A1* | 7/2019 | Delva ................. G01M 17/007 |
| 2019/0227164 | A1 | 7/2019 | Wantenanaar et al. |
| 2019/0303759 | A1* | 10/2019 | Farabet ................... G06F 9/455 |
| 2020/0025875 | A1 | 1/2020 | Maier |
| 2021/0276587 | A1* | 9/2021 | Urtasun ................... G06N 3/08 |
| 2021/0294944 | A1* | 9/2021 | Nassar ................. B60W 50/00 |
| 2021/0318424 | A1* | 10/2021 | Wang ....................... G01S 7/41 |

OTHER PUBLICATIONS

VT System—Modulare Test-Hardware, Vector, Mar. 4, 2020, 9 pgs.
F. M. Maier et al. "Environment perception simulation for radar stimulation in automated driving function testing", Elektrotechnik & Informationstechnik (2018) 135/4-5: p. 309-315.

* cited by examiner

EMULATED
PICTURE

202a1

202a2

300a

CAMERA SENSOR

EMULATED
RADAR REFLECTION
SIGNAL

202b1

300b

RADAR SENSOR

AUTONOMOUS DRIVE EMULATION METHODS AND DEVICES

CROSS-REFERENCE TO RELATED APPLICATION

A claim of priority is made to U.S. provisional application No. 63/043,172, filed Jun. 24, 2020.

BACKGROUND

The inventive concepts generally relate to autonomous vehicles, and more particularly, the inventive concepts relate to the emulation of drive scenarios for use in assessing the performance of sensors and/or control units of autonomous drive control systems.

Modern cars increasingly incorporate so-called Advanced Driver Assistance Systems (ADAS). Among these, already well established are Emergency Brake Assist (EBA) and Lane Assist (LA) systems, with the goal being fully autono- mous vehicles. All these systems require sensors to allow an electronic (or engine) control unit (ECU) of the vehicle to gather sufficient information indicative of the surrounding environment. Examples of commonly used and/or proposed ADAS sensors include ultrasonic sensors, video cameras, radar sensors and lidar (or LiDAR) sensors.

One major challenge when developing ADAS equipped vehicles is to verify proper operations in the myriad of different scenarios which might occur in real traffic. To carry out this verification in real life is not a suitable possibility, as it is hard to achieve the required coverage (i.e. to actually test all relevant scenarios) and this would require too much time (hundreds of thousands of hours). Additionally, all sensors must be verified in concert as it is important to verify that the ECO makes the right decision based on the data it is gathering from all sensors. This is referred to as "sensor fusion."

Several simulation tools are available which allow for testing of different driving scenarios in a virtual world (scenario simulation). These simulations can incorporate the operation of different sensors. However, in order to test the real behavior of those sensors it is necessary to integrate the actual sensor fusion hardware into the test system, particu- larly since many current sensors already incorporate algo- rithms to identify objects and provide pre-processed data to the ECU.

SUMMARY

According to an aspect of the inventive concepts, a hardware-in-loop (HiL) test system for testing sensor fusion of an advance driver assistance system (ADAS) is provided. The ADAS includes a plurality of sensors and an electronic control unit (ECU) processing outputs of the sensors. The HiL test system includes a three-dimensional (3D) scenario simulator for generating drive scenarios including objects in a surrounding environment of a simulated vehicle, and a sensor target emulator for generating emulated sensors inputs to the plurality of sensors corresponding to the drive scenarios generated by the 3D scenario simulator. The sensor target emulator is configured to synchronize the emulated sensor inputs by interpolating a current location of the objects from parameters extracted from the drive sce- narios.

The parameters extracted by the sensor target emulator may include object locations, object velocities and object accelerations of the objects from the drive scenarios.

The sensors may include at least one radar sensor, and the sensor target emulator may be configured to carry out ray tracing of the objects in the drive scenarios for each of the at least one radar sensor.

In addition, the sensor target emulator may include an array of radar receivers and transmitters which emulate the sensor input to each of the at least one radar sensor.

In addition to a radar sensor, the sensors may include a camera and/or a lidar sensor.

The sensor target emulator may include a graphics pro- cessing unit (GPU) which predicts a location of the objects based on the object locations, object velocities and object accelerations extracted from the drive scenarios. The GPU may further carry out ray tracing of the objects in the drive scenarios for each of the at least one radar sensor.

The 3D scenario simulator and the sensor target emulator may be operated on a real-time operating system (RTOS).

According to another aspect of the inventive concepts, a sensor target emulator is provided for generating emulated sensors inputs to a plurality of sensors. The sensor target emulator includes a parameter extractor configured to extract parameters from an externally supplied three-dimen- sional (3D) drive scenario, a radar target emulator config- ured to drive a radar antenna to output an emulated radar reflection by manipulating a received radar signal according to the parameters extracted by the parameter extractor, and a camera target emulator configured to drive a camera device to output an emulated video image according to the param- eters extracted by the parameter extractor. The sensor target emulator is configured to synchronize the emulated radar reflection and emulated video image by interpolating a current orientation of objects in the 3D drive scenario from the parameters extracted from the drive scenarios.

The sensor target emulator may further include a lidar emulator configured to drive a lidar emitter to output an emulated light reflection according to parameters extracted by the parameter extractor. In this case, the sensor target emulator is further configured to synchronize the emulated light reflection with the emulated radar reflection and emu- lated video image by interpolating the current location of the objects from parameters extracted from the drive scenarios.

The extracted parameters may include object locations, object velocities and object accelerations of the objects from the drive scenarios.

The parameter extractor may be configured to carry out ray tracing of the objects in the 3D drive scenarios.

The sensor target emulator may include an array of radar receivers and transmitters.

The sensor target emulator may further include a graphics processing unit (GPU) configured to carry out ray tracing of the objects in the 3D drive scenario. The GPU may be further configured to predict a location of the objects based on the object locations, object velocities and object accel- erations.

The sensor target emulator may be configured to operate on a real-time operating system (RTOS).

According to still another aspect of the inventive con- cepts, a method of testing sensor fusion of an advance driver assistance system (ADAS) is provided. The ADAS includes a plurality of sensors and an electronic control unit (ECU) processing outputs of the sensors. The method includes using a three-dimensional (3D) scenario simulator to gen- erate drive scenarios including objects in a surrounding environment of a simulated vehicle, generating emulated sensors inputs to the plurality of sensors corresponding to the drive scenarios generated by the 3D scenario simulator, and synchronizing the emulated sensor inputs by interpolating a current location of the objects from parameters extracted from the drive scenarios.

The parameters extracted may include object locations, object velocities and object accelerations of the objects from the drive scenarios.

BRIEF DESCRIPTION OF THE DRAWINGS

The above and other aspects and features of the inventive concepts will become readily apparent from the detailed description the follows, with reference to the accompanying drawings, in which.

DETAILED DESCRIPTION

Figure 1:
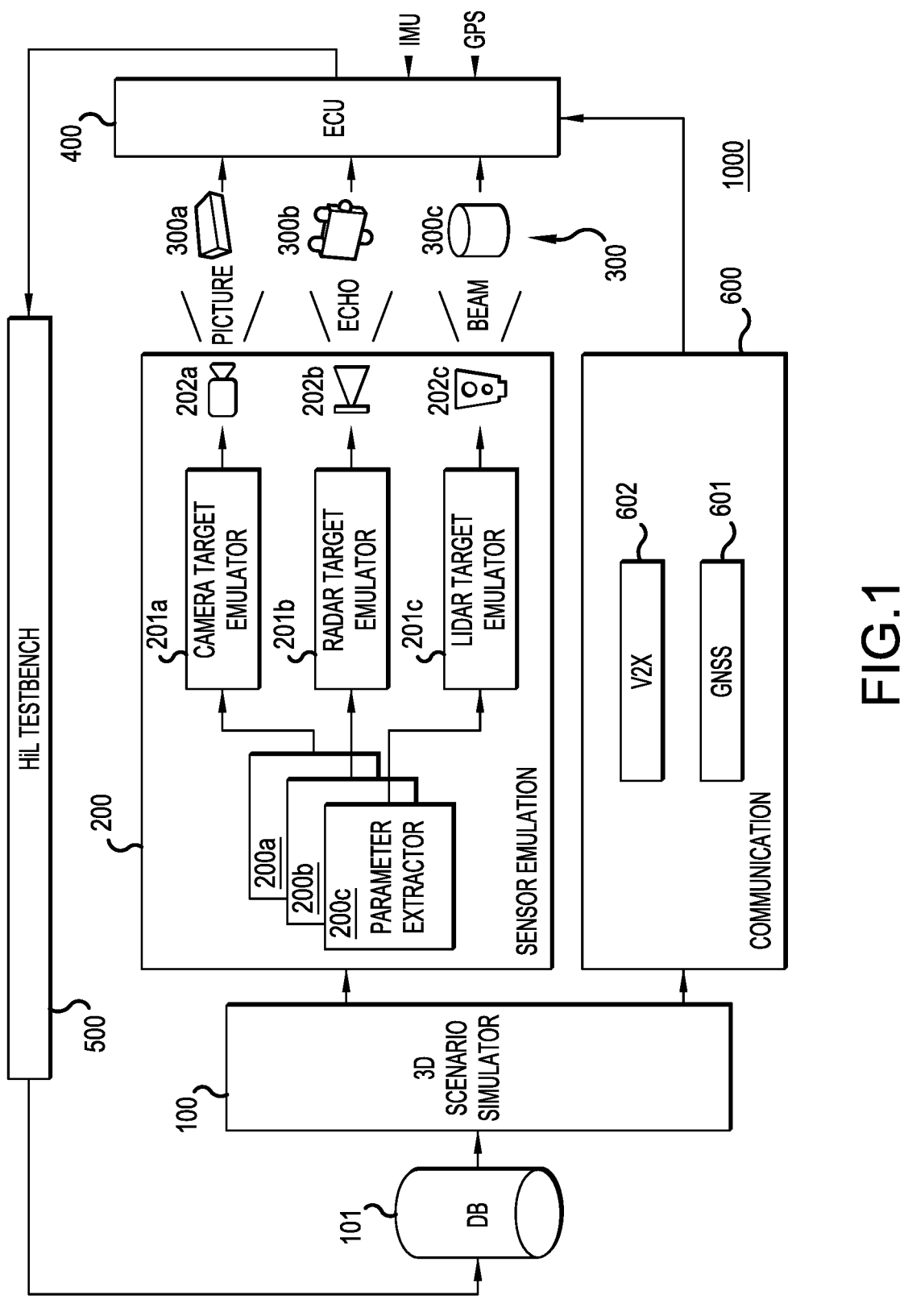
FIG. 1 is a high-level block diagram showing the architecture of an autonomous driving emulation (ADE) platform according to an embodiment of the inventive concepts.

Embodiments of the inventive concepts will now be described with reference to the accompanying drawings. Throughout the drawings, like reference numbers refer to the same or similar elements. Separately, as is traditional in the field of the inventive concepts, example embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the example embodiments may be physically separated into two or more interacting and discrete blocks, units and/or modules without departing from the scope of the example embodiments. Further, the blocks, units and/or modules of the example embodiments may be physically combined into more complex blocks, units and/or modules without departing from the scope of the example embodiments.

As previously mentioned, there are solutions on the market which address virtual testing of ADAS systems. For example, one approach has been suggested to test sensor fusion of radar, lidar and vehicle-to-everything (V2x) communication, with emphasis on the need to synchronize the stimulus to the different sensors. The suggested system utilizes a radar target simulator in which the radar sensor itself is mechanically moved so its orientation towards the radar target simulator can be changed. This implies that it can only perceive one object from one direction at the same time, even though this direction can be altered. Another system has been proposed in which the number of radar target simulators is increased to five and their antennas are moved instead of the radar sensors. This increases the number of objects which can be presented to the sensor to five. Separately, there are different approaches as to the manner in which the information for the radar target simulator is extracted from the simulation. In one approach an object is treated as a single point. Additionally, it is evaluated how strongly a radar signal is reflected by these objects if being perceived from all different directions. This is referred to as Radar Cross Section (RCS). With this approach the simulator determines in which direction is seen from the radar and in which angle it is facing the radar. The information is used for determining the effective RCS in this situation. The resulting RCS is then used to calculate the shape of the corresponding echo to be sent to the radar. An enhancement of this approach is to represent an object by a set of significant points. Then the radar echo is calculated for these points being aggregated into a combined echo.

A different approach is based on so-called Ray Tracing. In the simulation of this approach, the path of a propagation (rays) of the radar is calculated, as is the manner in which the rays are reflected back or in different directions by objects. In contrast to the RCS approach described above, no map of the objects is required. Instead the resulting echo is calculated intrinsically. Even though this approach is being used in simulation, current radar target simulators have difficulties in directly replicating the results as they are limited in both the number of objects they can represent and the directions in which the echoes are sent back to the radar.

As will be described below, the inventive concepts enable the implementation of a radar target simulation solution which can generate echoes for multiple objects without any inherent restriction on the number of those objects. Additionally, those objects are not represented by point objects or a set of point objects. Instead the echo of an object with spatial extension can be emulated. In addition, the inventive concepts allow for the synchronization of multiple sensors of different type.

In some embodiments of the inventive concepts, an approach is adopted in which ray tracing is used in conjunction with a scenario simulator to provide an ADAS test that is able to handle scenarios that are more complex than those handled by previous solutions.

In addition to radar, the inventive concepts are extendable to include other sensors like cameras and lidar, and vehicle communication to other vehicles and infrastructures (e.g., vehicle-to-everything (V2X) communication technology).

FIG. 1 is a high-level block diagram showing the architecture of an autonomous driving emulation (ADE) platform 1000 according to an embodiment of the inventive concepts.

Referring to FIG. 1, the ADE platform 100 includes a 3D scenario simulator 100, a sensor target emulator 200, sensors 300, an electronic control unit (ECU) 400, a Hardware-In-the-Loop (HiL) testbench 500, and a communication module 600.

The sensors 300 of this example include a camera sensor 300*a*, a radar sensor 300*b* and a lidar sensor 300*c*. However, the inventive concepts are not limited to this exemplary combination of sensors. Each sensor 300 is configured to sense a surrounding environment of a vehicle equipped with ADAS functionality.

The ECU 400 is a dedicated module of a vehicle that is responsible for the ADAS functions of the vehicle. In order to assess a surrounding environment, the ECU 400 fuses sensor data from the sensors 300, data from vehicle inertial measurement units (IMUs), information sent from other entities via the module 600, and global positioning system (global navigation satellite system (GNSS)) data. The ECU 400 may be centralized in a single processing unit or distributed among multiple processing units.

The ECU 400 as driven by the sensors 300 constitute the device under test (DUT) of the ADE platform 1000 of FIG. 1.

The example of FIG. 1 is built around scenario simulation linked to the HiL testbench 700. A test sequencer (not shown) may control both the scenario simulator 100 and the HiL testbench which operate in parallel.

The 3D scenario simulator 100 is a software-implemented simulation device for creating a variety of vehicle drive scenarios that are selected and/or created by a user. Generally, the 3D scenario unit will include or have access to a database (DB) 101. The DB 101 contains drive scenarios, sensing properties (e.g., radar scattering or lidar reflectivity properties) of various materials and objects found in the drive scenarios, dynamics of the vehicle and other objects (including the road) encountered in the drive scenarios, and other information relevant to the physical responses of the vehicle and objects in any given scenario. An example of the 3D scenario simulator 100 is offered by IPG Automotive GMBH under the tradename Carmaker®. Among other things, the 3D scenario simulator 100 addresses testing for ADAS and autonomous vehicles. Tools and models may be provided to build virtual road environments, vehicle dynamics, traffic, sensors, real or virtual drivers, headlights, weather conditions and scenario scripting.

Inside the 3D scenario simulator 100, several driving scenarios may be simulated and supplied to the sensor target emulator 200. For all objects in the scenario, the material properties with respect to optical and radar reflectivity may also be provided. Based on this information, the sensor target emulator 200 extracts information as to the manner in which the objects would be perceived by the camera sensor 300*a*, the radar sensor 300*b* and the lidar sensor 300*c*. Based on the extracted information, hardware of the sensor target emulator 200 is driven to emit sensing signals to the sensors 300 which emulate the driving scenarios supplied from the 3D scenario simulator 100.

For example, the sensor target emulator 200 may include a parameter extractor 200*a*, a camera target emulator driver 201*a* and a monitor 202*a* for generating a video image emulating a driving scenario of the 3D scenario simulator 100. In operation, the parameter extractor 200*a* may extract image pixel data (x, y, R, B and G) corresponding to the driving scenario of the 3D scenario simulator 100. The extracted data may include shading and direct sunlight effects. This image pixel data (x, y, R, B and G) may be supplied to the camera target emulator driver 201*a* which in turn drives the monitor 202*a* to display an image (picture) corresponding to the image pixel data (x, y, R, B and G). The monitor 202*a* may be arranged in front of the camera sensor 300*a*. In this way, the emulated image of the driving scenario displayed on the monitor 202*a* is viewed by the image sensor 300*a* and processed accordingly by the ECU 400.

The sensor target emulator 200 may further include a parameter extractor 200*b*, a radar target emulator driver

201*b* and a radar receiver/transmitter 202*b*. The radar receiver/transmitter 202*b* is for receiving the radar signal from the radar and for sending back a manipulated version of the received signal as a radar echo emulating a radar reflection of the driving scenario of the 3D scenario simulator 100. In operation, the parameter extractor 200*b* may extract radar related data of the driving scenario from the 3D scenario simulator 100. As will be explained below, this may include ray tracing in which the location (x, y) and distance (signal delay) of multiple objects of the driving scenario are represented. In addition, radar signatures of objects may be extracted, such as object velocity (Doppler) and object size/distance (attenuation). As will be understood, the radar cross section is a combination of object size and reflectivity. The reflectivity may be mapped to the attenuation being used for an individual pixel (described below in connection with FIG. 3) and the spatial dimension to an amount of pixels used to represent the object. This data may be supplied to the radar target emulator driver 201*b* which in turn drives a radar receiver/transmitter 202*b* to emit a "reflected" radar signal corresponding to the driving scenario. The radar receiver/transmitter 202*b* may be arranged in front of the radar sensor 300*b*. In this way, the emulated radar reflection of the driving scenario emitted by the radar receiver/transmitter 202*b* is sensed by the radar sensor 300*b* and processed accordingly by the ECU 400.

The sensor target emulator 200 may further include a parameter extractor 200*c*, a lidar target emulator driver 201*c* and a lidar beam emitter 202*c* for generating a lidar beam emulating a light reflection of the driving scenario of the 3D scenario simulator 100. In operation, the parameter extractor 200*c* may extract lidar related data of the driving scenario from the 3D scenario simulator 100. Generally, this data will consist of the range of objects at locations (x, y) within the driving scenario as represented by the delay of reflected light. This data may be supplied to the lidar target emulator driver 201*b* which in turn drives the lidar beam source 202*c* to emit a "reflected" light signal with a given delay corresponding to the driving scenario. The lidar beam emitter 202*c* may be arranged in front of the lidar sensor 300*c*. In this way, the emulated light reflection of the driving scenario emitted by the lidar beam emitter 202*c* is sensed by the lidar sensor 300*c* and processed accordingly by the ECU 400.

As mentioned previously, the inventive concepts are extendable to include global positioning system (global navigation satellite system (GNSS)) and vehicle-to-everything (V2X) communication technology. This is schematically represented in FIG. 1 by a communication module 600 including a GNSS sub-module 601 and a V2X sub-module 602. In addition to fusing sensor data from the sensors 300, the ECU 400 may fuse V2X and GNSS data of the communication module 600 operating interactively with the 3D scenario simulation. In this manner, vehicle-to-everything communication links and global positioning system functionality can be simulated within the drive scenario.

Figure 2:
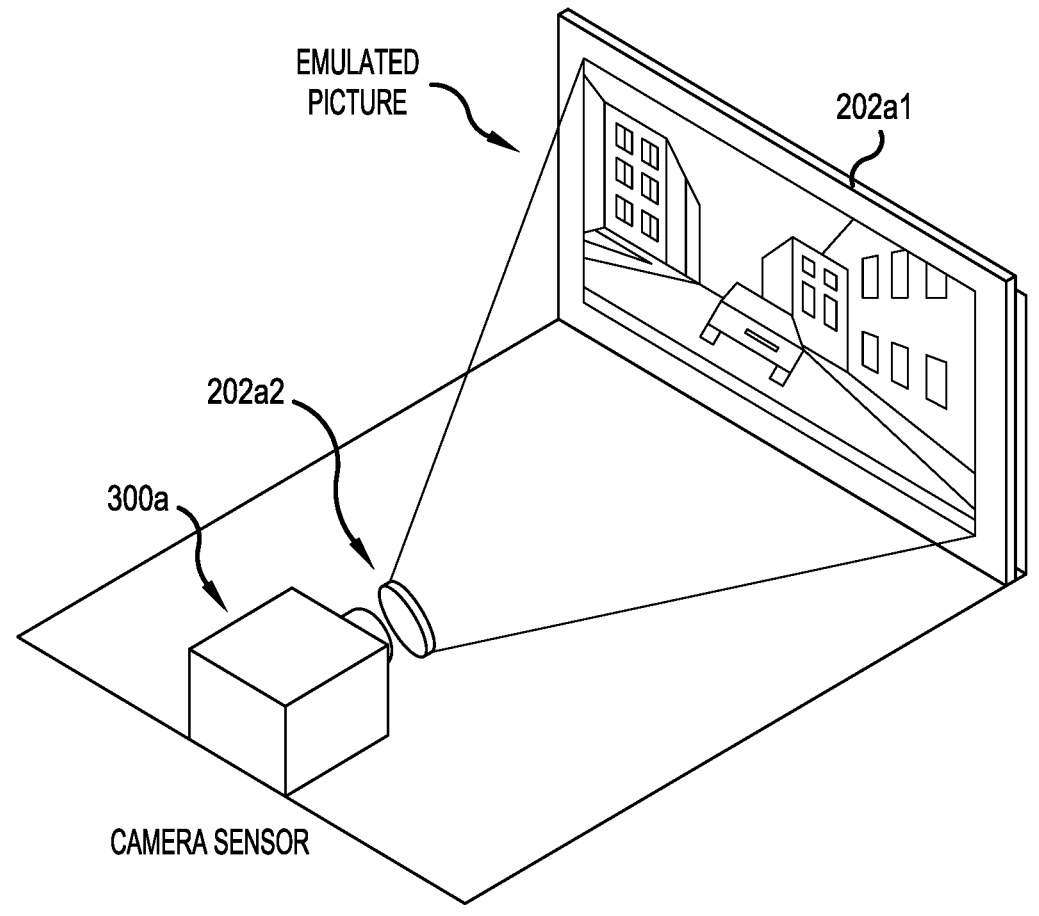
FIG. 2 is a perspective view for reference in explaining operations associated with the camera sensor of FIG. 1.

FIG. 2 is a perspective view for reference in explaining operations associated with the camera sensor 300*a* of FIG. 1.

Referring collectively to FIGS. 1 and 2, an emulated picture depicting the driving scenario is displayed on screen 202*a*1 of the monitor 202*a* and viewed by the camera sensor 300*a*. An optical lens 202*a*2 may be provided to project the size of the screen 202*a*1 to the viewing angle of the camera sensor 300*a*. Although not shown, the camera sensor 300*a* may be placed in a chamber with the screen 202*a*1 of the monitor 202*a*.

Figure 3:
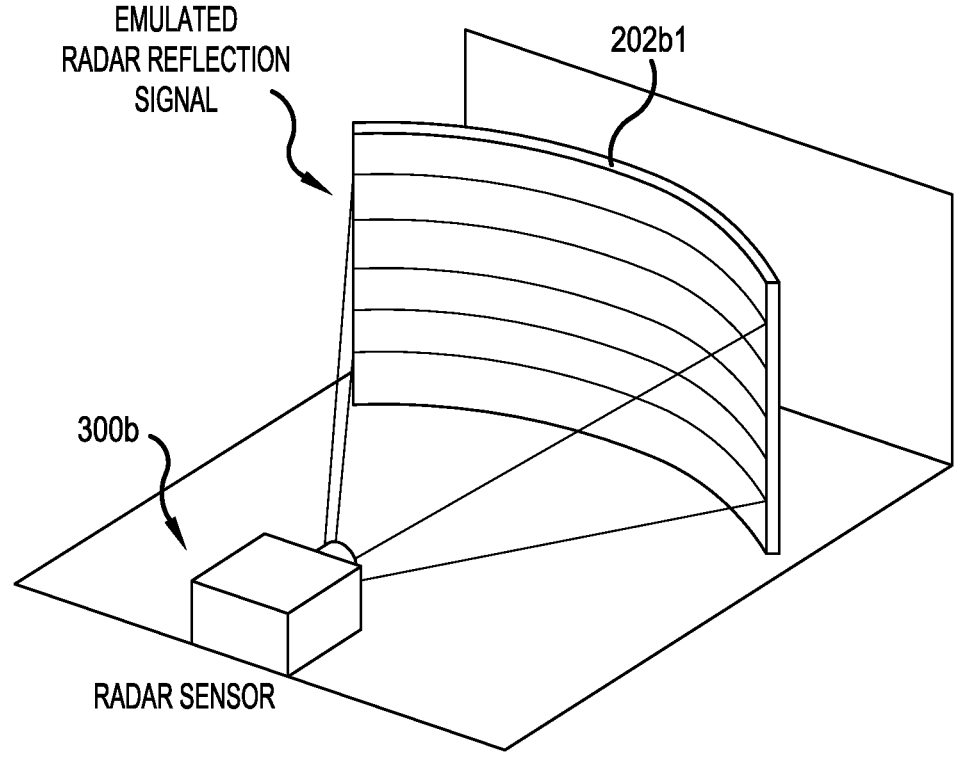
FIG. 3 is a perspective view for reference in explaining operations associated with the radar sensor of FIG. 1.

FIG. 3 is a perspective view for reference in explaining operations associated with the radar sensor 300*b* of FIG. 1.

Referring collectively to FIGS. 1 and 3, an emulated reflected radar signal of the driving scenario is emitted from a radar screen 202*b*1 of the radar receiver/transmitter 202*b* and sensed by the radar sensor 300*b*. That is, in the example of this embodiment, the radar receiver/transmitter 202*b* is configured by an array of "radar "pixels" analogous to a video screen. Each pixel is configured to receive (via a receiver of the pixel) a radar signal (or chirp) from the radar sensor 300*b*, and to manipulate the received signal according to extracted parameters to emit (via a transmitter of the pixel) an echo as a response to the radar chirp. Each pixel signal transmitted represents an object distance, object speed (in the z-direction orthogonal a surface of the screen), and echo strength. Large objects or objects close to the radar sensor 300*b* may be represented by multiple pixels according to their width and height (in the x/y directions). Multiple objects close to each other may be discerned as they approach in the driving scenario. Additionally, overlapping objects and objects which pass behind each other can be emulated. Although not shown, the radar sensor 300*a* may be placed in a chamber with the radar screen 202*b*1 of the radar receiver/transmitter 202*b*.

Radar target simulators conventionally operate with a small number of antennas that are either placed at fixed locations or can be mechanically moved. In contrast, in the example of the present embodiment, an array of radar target simulators is implemented, which are described above as "radar pixels" similar to the pixels of a video monitor. This arrangement allows to for the placement and movement of objects virtually at any location and with any speed in front of the radar sensor without the need for mechanical movements. Additionally, objects are not limited to point objects since multiple "radar pixels" can be combined to emulate the spatial extension of an object.

Figure 4:
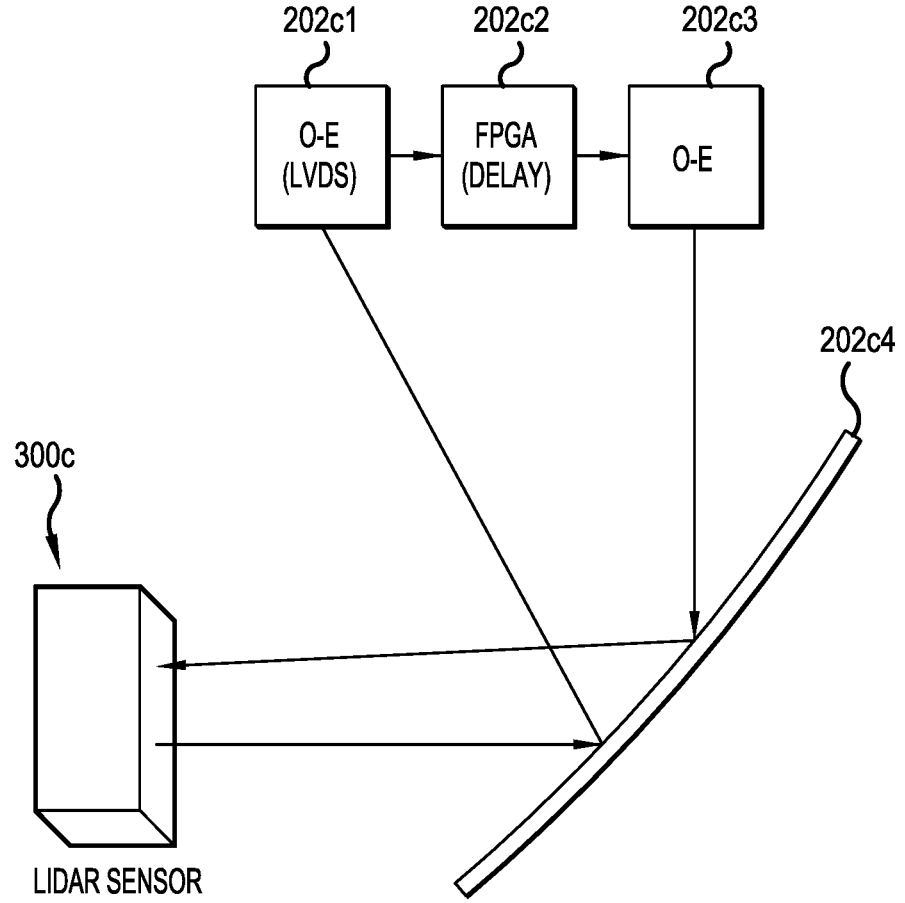
FIG. 4 is a perspective view for reference in explaining operations associated with the lidar sensor of FIG. 1.

FIG. 4 is a perspective view for reference in explaining operations associated with the lidar sensor 300*c* of FIG. 1.

Referring collectively to FIGS. 1 and 4, the lidar beam emitter 202*c* of this example includes an optical-to-electrical convertor (O-E) 202*c*1, a field programmable gate array (FPGA) 202*c*2 and an electrical-to-optical convertor (E-O) 202*c*3. In operation, a light pulse is emitted from the lidar sensor 300*c* and received by the O-E 202*c*1 of the lidar beam emitter 202*c*1. An output of the O-E 202*c*1 may be supplied as low-voltage differential signaling (LVDS) to the FPGA 202*c*2. Here, a delay is introduced in the signal according to the delay parameters extracted from the driving scenario by parameter extractor 200*c*. For example, in the case of a 500 MHz clock, the delay resolution is 250 ps. The delayed electrical pulse is sent to the E-O 202*c*3, and a corresponding delayed light pulse (emulating a reflected light pulse) is returned to lidar sensor 300*c*. FIG. 4 additionally illustrates an optional curved reflective surface 202*c*4 from which the initial and return light pulses are reflected. Further, although not shown, the components illustrate in FIG. 4 may be placed in a chamber.

Figure 5:
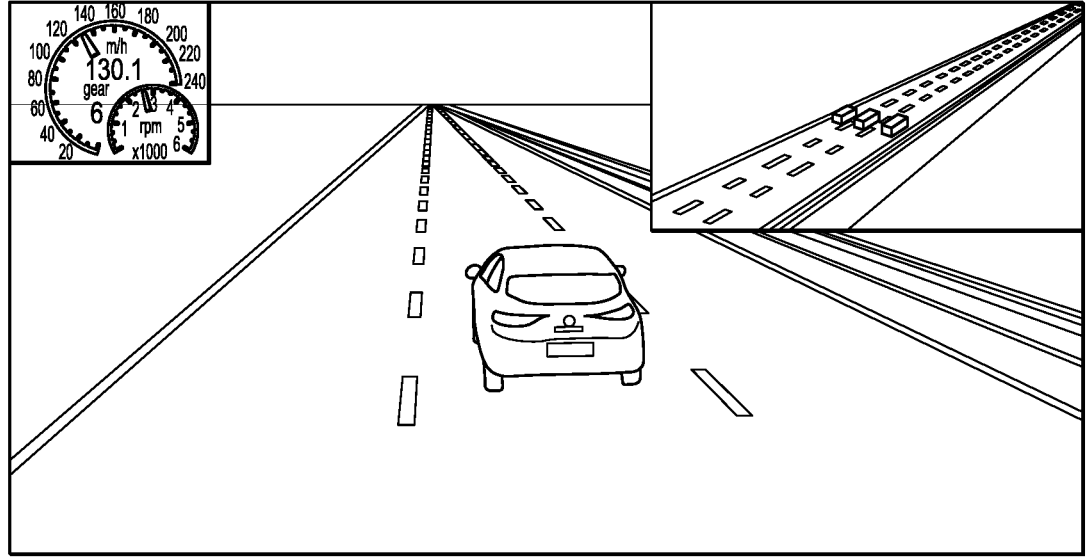
FIG. 5 is a graphic depicting the example of a scene of a driving scenario generated by the 3D scenario simulator of FIG. 1.

As the sensors 300 are connected to the ECU 400 to be tested, it is possible to observe the decisions being made by the software running on the ECU 400 to determine whether it is operating properly. It is also possible to link the ECU 400 with the scenario simulation via a driver-controlled simulation model of the car. In this case the decisions of the ECU 400 based on the sensor data directly affect the behavior of the car in the simulation. This reaction in turn influences what the sensors will "see". For instance, attention is directed to the graphic of FIG. 5 depicting the example of a scene of a driving scenario generated by the 3D scenario simulator 100. Assume the simulation model of the car to be tested (also referred to the ego car or ego vehicle) approaches three cars being stopped on different lanes of the road as shown. Initially, the radar sensor will sense the information that there are three objects approaching with a relative speed of, for example, 130 km/h. If the emergency brake assist (EBA) system is working correctly it will trigger the brake of the ego car, which consequently slows down. This effects the relative speed as being extracted for the radar sensor, which closes the complete loop from sensor input through reaction of the ego car back to sensor input. When closing this loop, it is important that the information being presented to the remaining sensors (i.e. camera, radar, Lidar, . . . ) is synchronized with the current state of simulation. This requires some means to compensate for propagation delay when processing the data. Additionally, the information must be presented with a sufficiently high update rate (a.k.a. frame rate). Otherwise the sensors might not perceive sufficiently smooth movements and some valid data may be considered as disturbances and consequently discarded.

Figure 6:
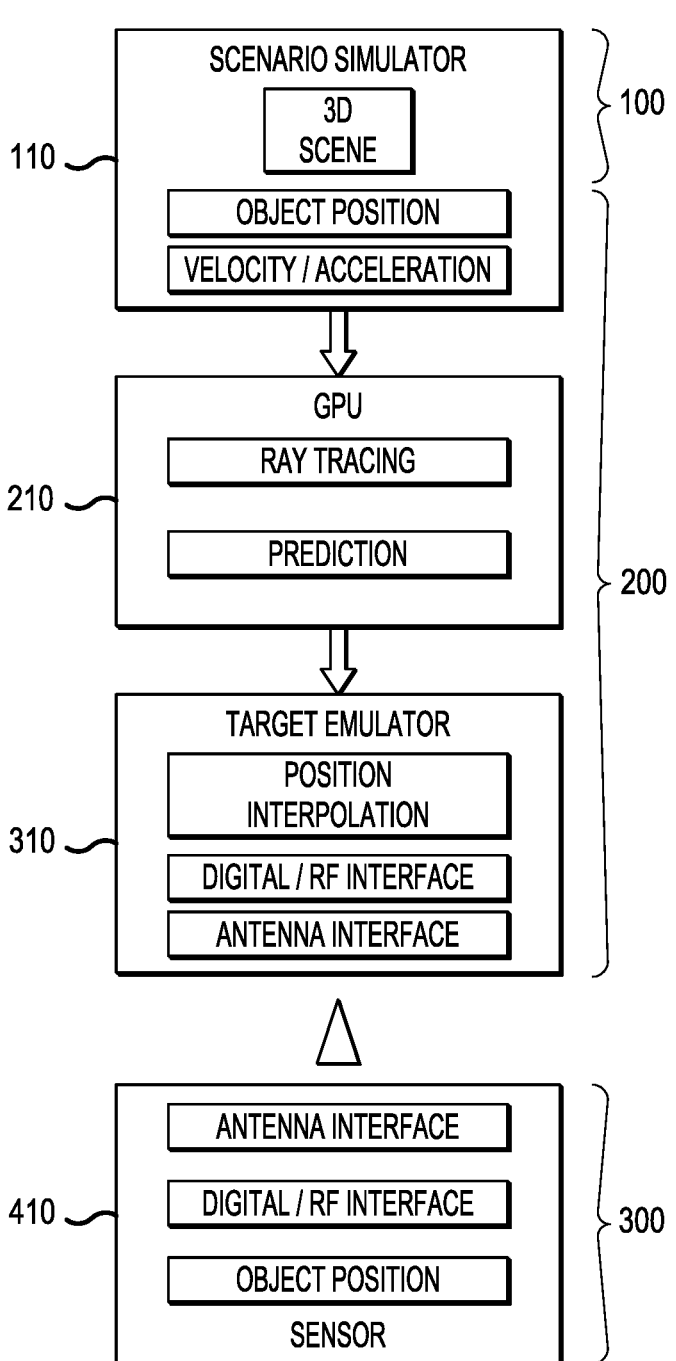
FIG. 6 is a diagram representing the operational flow of an autonomous drive platform for ensuring synchronization of sensors according to an embodiment of the inventive concepts.

In an embodiment of the inventive concepts, a predication and extrapolation scheme are implemented to compensate for the aforementioned propagation delay when processing the data. In this respect, FIG. 6 is an operational flow diagram for reference in describing an autonomous drive platform which ensures synchronized sensor images. FIG. 6 is a diagram representing the operational flow of the autonomous drive platform.

Block 110 of FIG. 6 represents operations associated with development of the 3D scenario. Here, the 3D scenario simulator 100 creates a 3D driving scenario as described previously. Then, the sensor target emulator 200 not only extracts the position of objects in the scenario simulator extracted, but also their velocity and their acceleration.

Then, at block 210 of FIG. 6, ray tracing and prediction operations are carried out by a graphics adapter or graphics processing unit (GPU) of the sensor target emulator 200. That is, based the position, velocity and acceleration extracted at block 1200, the parameters of a function describing the trajectory of the object can be extracted by the GPU. From this, an object location/orientation may be predicted. This information is passed to the target emulator along with a timestamp as to when this extraction has been performed. It is noted that the prediction is optional, and in some embodiments, the prediction is omitted.

At block 310 of FIG. 6, a target emulator of the sensor target emulator 200 has a synchronized time reference (e.g., based on IEEE 1588). Based on the previously delivered parameters and the current time it interpolates the position of the objects (and its speed) for the current time and therefore effectively eliminates the propagation delay from the scenario simulator to the target simulator. The interpolation fills in times between ray tracing results and/or predictions generated at block 210. The antenna (e.g., radar emitter) is driven accordingly via a digital to RF interface and antenna interface to emit an emulated "reflected" signal. This signal is received, and the object detected at block 410 which denotes the sensor functionality of an antenna interface, an RF-to-digital interface, and object detection.

Before the information is being sent to the sensors it can be manipulated to emulate error or disturbances. Alternatively, or additionally, it is also possible to add further signal sources to the setup to emulate interference by active sensors (e.g. the radar of another car). This way it is possible to test the robustness of the sensor fusion algorithm (e.g., to test whether the sensor fusion can compensate errors and/or whether the system can detect a malfunction and act accordingly).

As noted above, in an embodiment of the inventive concepts, the extraction of sensor data is based on ray tracing being computed using the processing unit of a graphics adapter (GPU). This will be described further using radar as an example and a simple scenario.

Figure 7A:
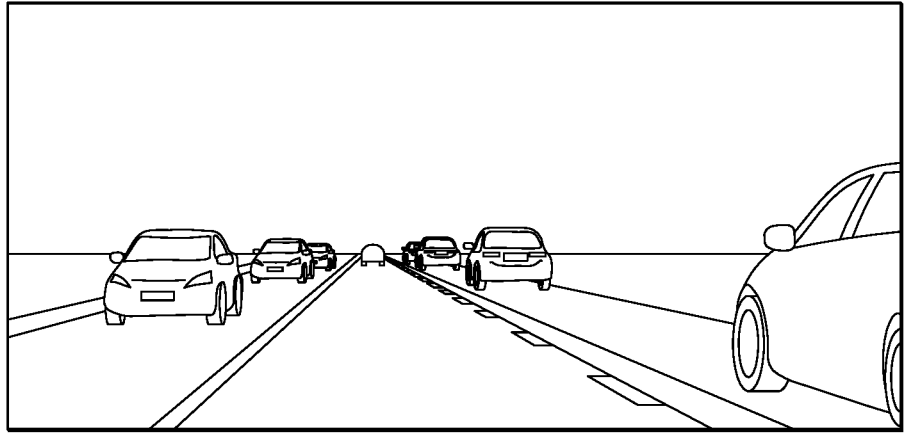
FIGS. 7A and 7B are graphics for reference in explaining ray tracing of objects in a drive scenario.
Figure 7B:
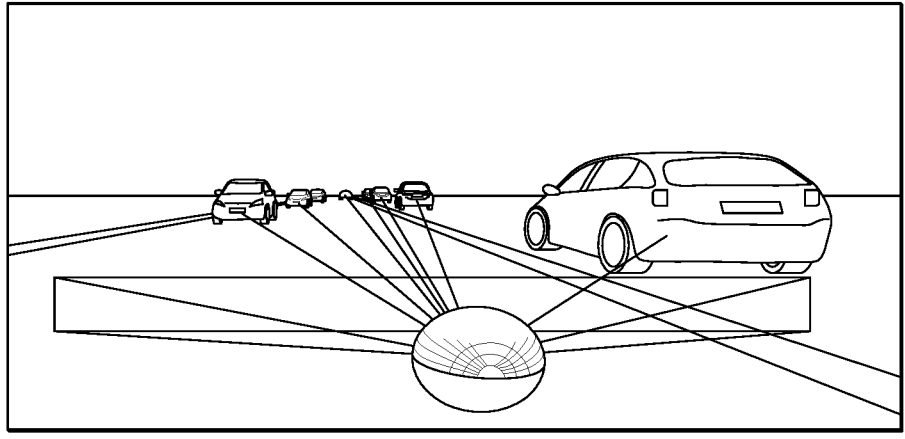

FIG. 7A is a screen shot taken from a scenario simulation. To calculate how this scene is being perceived by a radar sensor, several rays are being "send out" from the location of a front radar sensor within the field of view of the radar sensor. If those rays hit an object, they are reflected back towards the radar sensor. FIG. 7B is a visualization of this for the same scene. In addition to object location, the distance and relative speed are also extracted. Finally, the reflectivity of the objects for radar waves is taken into account. All this information can be used for emulating the same scene for a radar sensor. This in turn does forward this information to the corresponding ECU.

Approaches to extract the information as to how a radar perceives an object from a scenario simulation are to firstly determine the reflectivity (or radar cross section—RCS) from different angles. This can be done in a separate simulation also using ray tracing. This greatly reduces the computational effort in the scenario simulator itself as it only has to consider from which angle the object is "seen" by the radar in the final scenario. It is noted that due to reflections a radar can see the same object at different locations like a car in front of the ego car and therefore to the left-hand side of the guard rail and its reflection to the right on the other side of the guard rail. However, the same principle applies for both the object being in straight line of sight and the "other" reflected object. With the availability of GPUs providing hardware-accelerated computation of ray tracing it is possible to all do this in real-time while running the scenario simulation, rendering obsolete the step to generate an RCS model.

It is noted that the 3D scenario simulator and the target sensor emulator may be driven on a real time operating system (RTOS), which interfaces with a host computer workstation. Alternately, an operating system with sufficiently high computational power may be utilized. In either case, the operating system RTOS may exchange information with the radar/video interfaces (all required data to replicate the "images" those sensors "see") and physical parameters of a vehicle model. For example, a radar interface and radar target simulator (RTS) may be provided for each of four side radar sensors and one front radar sensor of a vehicle. In addition, a video interface and monitor may be provided for the front camera of the vehicle. The ROTS may also interface via a bus system with actual hardware (i.e. the sensors and the ECU under test) of the ADAS. Exemplary interfaces include USB-OBD2 interfaces and OBD II plug. The ADAS may interface over a gateway of the HiL System with control systems (e.g., brake systems) of the vehicle.

Another application of the test bench is to use it for characterizing the behavior of the different sensors. This can be used to create simulation models of the sensors. With this in place all hardware can be replaced by corresponding simulation models. The scenario simulator and the ray tracing algorithm would still be in place, but in this case the ECU is may be represented by its software algorithm With this setup these software algorithms can be tested without the integration of hardware other than that of the computation platform. If the computational power is high enough this allows for simulation running faster than real time and/or it allows to run many simulations in parallel as the computation platforms can be scaled much more cost effectively.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. While representative embodiments are disclosed herein, one of ordinary skill in the art appreciates that many variations that are in accordance with the present teachings are possible and remain within the scope of the appended claim set. The invention therefore is not to be restricted except within the scope of the appended claims.

What is claimed is:

1. A hardware-in-the-loop (HiL) test system for testing sensor fusion of an advance driver assistance system (ADAS), the ADAS includes a plurality of sensors and an electronic control unit (ECU) processing outputs of the sensors, the HiL test system comprising:
   a three-dimensional (3D) scenario simulator for generating drive scenarios including objects in a surrounding environment of a simulated vehicle;
   a sensor target emulator for generating emulated sensors inputs to the plurality of sensors corresponding to the drive scenarios generated by the 3D scenario simulator,
   wherein the sensor target emulator is configured to synchronize the emulated sensor inputs by interpolating a current location of the objects from parameters extracted from the drive scenarios.

2. The HiL test system of claim 1, wherein the parameters extracted by the sensor target emulator include object locations, object velocities and object accelerations of the objects from the drive scenarios.

3. The HiL test system of claim 2, wherein the sensor target emulator includes a graphics processing unit (GPU) sensor which predicts a location of the objects based on the object locations, object velocities and object accelerations.

4. The HiL test system of claim 3, wherein the sensors include at least one radar sensor, and the GPU carries out ray tracing of the objects in the drive scenarios for each of the at least one radar sensor.

5. The HiL test system of claim 1, wherein the sensors include at least one radar sensor.

6. The HiL test system of claim 5, wherein the sensor target emulator is configured to carry out ray tracing of the objects in the drive scenarios for each of the at least one radar sensor.

7. The HiL test system of claim 6, wherein the sensor target emulator includes an array of radar receivers and transmitters which emulate the sensor input to each of the at least one radar sensor.

8. The HiL test system of claim 1, wherein the sensors include a radar sensor and a camera.

9. The HiL test system of claim 8, wherein the sensors further include a lidar sensor.

10. The HiL test system of claim 1, wherein the 3D scenario simulator and the sensor target emulator are operated on a real-time operating system (RTOS).

11. A sensor target emulator for generating emulated sensors inputs to a plurality of sensors, comprising:
   a parameter extractor configured to extract parameters from an externally supplied three-dimensional (3D) drive scenario;

11 a radar target emulator configured to drive a radar antenna to output an emulated radar reflection by manipulating a received radar signal according to the parameters extracted by the parameter extractor; and a camera target emulator configured to drive a camera device to output an emulated video image according to the parameters extracted by the parameter extractor;

wherein the sensor target emulator is configured to synchronize the emulated radar reflection and emulated video image by interpolating a current orientation of objects in the 3D drive scenario from the parameters extracted from the drive scenarios.

12. The sensor target emulator of claim 11, further comprising:

a lidar emulator configured to drive a lidar emitter to output an emulated light reflection according to parameters extracted by the parameter extractor;

wherein the sensor target emulator is further configured to synchronize the emulated light reflection with the emulated radar reflection and emulated video image by interpolating the current location of the objects from parameters extracted from the drive scenarios.

13. The sensor target emulator of claim 11, wherein the extracted parameters include object locations, object velocities and object accelerations of the objects from the drive scenarios.

14. The sensor target emulator of claim 13, wherein the parameter extractor is configured to carry out ray tracing of the objects in the 3D drive scenario.

15. The sensor target emulator of claim 13, further including an array of radar transmitters and receivers.

16. The sensor target emulator of claim 11, further comprising a graphics processing unit (GPU) configured to carry out ray tracing of the objects in the 3D drive scenario.

17. The sensor target emulator of claim 16, wherein the GPU is further configured to predict a location of the objects based on the object locations, object velocities and object accelerations.

18. The sensor target emulator of claim 11, wherein the sensor target emulator is configured to operate on a real-time operating system (RTOS).

19. A method of testing sensor fusion of an advance driver assistance system (ADAS), the ADAS includes a plurality of sensors and an electronic control unit (ECU) processing outputs of the sensors, said method comprising using a three-dimensional (3D) scenario simulator to generate drive scenarios including objects in a surrounding environment of a simulated vehicle; and generating emulated sensors inputs to the plurality of sensors corresponding to the drive scenarios generated by the 3D scenario simulator; and synchronizing the emulated sensor inputs by interpolating a current location of the objects from parameters extracted from the drive scenarios.

20. The method of claim 19, wherein the parameters extracted include object locations, object velocities and object accelerations of the objects from the drive scenarios.

* * * * *